United States Patent [19]

McBride

[11] 4,421,608

[45] Dec. 20, 1983

[54] METHOD FOR STRIPPING PEEL APART CONDUCTIVE STRUCTURES

[75] Inventor: Donald G. McBride, Binghamton, N.Y.

[73] Assignee: International Business Machines Corporation, Armonk, N.Y.

[21] Appl. No.: 353,310

[22] Filed: Mar. 1, 1982

[51] Int. Cl.$^3$ .................. C25D 1/04; C25D 7/06; C23F 1/02
[52] U.S. Cl. .................................. 204/12; 156/150; 156/344; 156/629; 156/630; 156/634
[58] Field of Search ............... 156/344, 236, 231, 233, 156/629–634, 150, 151; 204/11, 12; 428/637, 666

[56] References Cited

U.S. PATENT DOCUMENTS

| | | | |
|---|---|---|---|
| 2,133,685 | 10/1938 | Coughlin et al. | 156/236 X |
| 2,765,267 | 10/1956 | Dorst | 156/344 X |
| 3,804,689 | 4/1974 | O'Connor | 156/236 X |
| 4,246,054 | 1/1981 | Nester | 156/631 X |
| 4,354,895 | 10/1982 | Ellis | 156/631 |

*Primary Examiner*—William A. Powell
*Assistant Examiner*—Thomas Bokan
*Attorney, Agent, or Firm*—Norman R. Bardales

[57] ABSTRACT

A fluid is applied between the carrier member and the conductive member of a peel apart structure during the peel apart operation between the carrier member and the conduction member. The fluid reduces the bonding strength between the carrier member and the conductive member and thus maintains the integrity of the conductive member as the carrier member is peeled away.

8 Claims, No Drawings

METHOD FOR STRIPPING PEEL APART CONDUCTIVE STRUCTURES

CROSS-REFERENCE TO OTHER APPLICATIONS

In co-pending patent application, Ser. No. 325,614, filed Nov. 27, 1981, entitled "Method For Making Laminated Multilayer Circuit Boards" of T. L. Ellis, now U.s. Pat. No. 4,354,895, issued Oct. 19, 1982, and assigned to the common assignee herein, there is described laminated multilayer circuit boards which use peel apart conductive structures in the fabrication thereof.

BACKGROUND OF THE INVENTION

1. Field of the Invention

This invention is related to peel apart conductive structures and more particularly to improvements in the stripping of such structures.

2. Description Of The Prior Art

The use of peel apart conductive structures in the fabrication of printed circuit boards is well known in the art, cf., for example, the aforementioned patent application, Ser. No. 325,614 now U.S. Pat. No. 4,354,895, herein incorporated by reference.

The peel apart conductive structure itself includes a thin conductive layer and a temporary carrier layer which is peelably adhered to the conductive layer in a superimposed configuration. It has become customary to provide an intermediate layer composed of a suitable release agent between the aforementioned carrier and conductive layers. For example, one such commercially available peel apart conductive structure comes as stock in the form of a flexible planar sheet. The conductive layer of the sheet is electrolytic plated cooper approximately 0.0002 inches thick and the carrier layer is electrolytic copper foil approximately 0.0028 inches thick. Between the two copper layers, there is provided a release agent, to wit: a chromium separator layer.

Heretofore, in the prior art of which I am aware, the stripping, i.e. peeling away of the carrier layer, has been done in what is termed herein as a dry mode. Thus, in the prior art, the carrier layer was merely peeled away without any intervening medium or agent, or if an agent was employed it was a solid and an integral part of the peel apart structure such as, for example, the aforedescribed chromium separator layer.

It has been found that even when a solid release agent is incorporated in the peel apart conductive structure, the separation of the carrier layer from the conductive layer has not been satisfactory. The bonding strength between the carrier layer and the conductive layer is not uniform and can vary widely in different areas of the same structure. When the carrier layer was peeled away from the conductive layer, it often would result in the removal of some of the conductive layer where it remained adhered to the carrier, and/or some of the carrier layer would remain adhered to the conductive layer. In either case, the integrity of the conductive layer was adversely compromised.

Moreover, if the compromised peel apart structure was used in the fabrication of circuit boards, it would adversely effect the finished product. For example, in one prior art method, the conductive layer of the peel apart structure is used as a base for additively plating thereon conductor circuitry, which circuitry is subsequently covered with an uncured glass epoxy that is thereafter partially cured. After curing, the carrier layer is peeled away and the thin conductive layer removed by a flash etchant leaving a cured epoxy laminate with the conductor circuitry flush mounted therein. This last mentioned method is described in detail in the aforementioned co-pending application in reference to the prior art discussed therein and FIGS. 1A-1E and 4 thereof. In this particular case, if the integrity of the conductive layer has been compromised as a result of some of it being removed with the peeled away carrier layer, the underlying additively plated conductors at the particular sites where the conductive layer has been so compromised is susceptible to being attacked by the etchant. As a result, undesirable pin holes or voids are produced in the conductors thereby adversely affecting their reliability, as well as the effectiveness of the lamination bond effected at the particular site to an adjacent laminate when the two are subjected to final cure. If, on the other hand, the conductive layer is compromised as a result of some of the carrier layer remaining on the conductive layer, the flash etchant is not effective in completely removing the conductive layer at the particular sites where the conductive layer is so compromised. Again, the reliability of the underlying conductors is adversely affected. Moreover, the planarity of the particular laminate is adversely effected, as well as the laminating bond at the particular site to an adjacent laminate.

In the case of the inventive method of the aforementioned co-pending application, after the conductor circuitry is additively plated to the conductive layer of the peel apart structure and prior to the covering thereof by the uncured glass epoxy, the conductive layer is personalized into a matching circuit pattern that is in register with the circuit pattern of the additively plated conductor circuitry. Next, an uncured glass epoxy is placed atop the conductor circuitry and partially cured. Thereafter, when the carrier layer is peeled away, there remains a cured epoxy glass laminate having embedded therein a composite conductor circuitry made up of the additively plated conductors and the conductive parts of the conductive layer to which the additively plated conductors are plated and such that the surface of the parts which was adjacent the carrier layer is flush mounted with the surface of the laminate. This last mentioned method is described in detail in the aforementioned co-pending application in reference to the description of the preferred embodiment described therein and FIGS. 2A-2E, and 3 and 5 thereof. When the carrier layer is peeled away, should some of the conductors formed from the conductive layer be compromised either as a result of the removal of some of the conductive layer conductors and/or the composite conductors, and/or as the result of some of the carrier layer remaining on the conductive layer conductors, similar deleterious effects are produced, to wit: poor conductor reliability, unreliable lamination bonding, and distortion of the laminate planarity.

Still in another prior art method, the conductive layer is first laminated to a glass epoxy lainate or substrate prior to the carrier layer being peeled away. After the carrier layer is peeled away circuitization takes place on the exposed surface of the conductive layer. Again, if the conductive layer is compromised in either of the two aforementioned ways, the same type of deleterious effects result.

SUMMARY OF THE INVENTION

It is an object of this invention to provide an improved method for stripping peel apart conductive structures.

It is another object of this invention to provide an improved method for stripping peel apart conductive structures used in the fabrication of printed circuit boards and the like.

According to one aspect of the present invention, there is provided a method for stripping a peel apart structure. The peel apart structure has carrier member means and conductive member means that are in a predetermined superimposed and peelably adhered relationship. The method comprises the steps of providing a fluid for reducing the bonding strength between the carrier member means and the conductive member means, and applying the fluid between the carrier member means and the conductive member means during the peel apart operation between the carrier member means and the conductive member means.

The foregoing and other objects, features and advantages of the invention will be apparent from the more particular description of the preferred embodiments of the invention, next herein described.

DESCRIPTION OF THE PREFERRED EMBODIMENTS

In accordance with the principles of the present invention, there is provided and applied between the conductive layer and the carrier layer of a peel apart conductive structure during the peel apart operation, i.e. when the carrier layer is being peeled away from the carrier layer, a fluid which reduces the bonding strength between the two layers. The present method is thus carried out in what is termed herein as a wet mode to distinguish it from the aforementioned dry mode associated with the peel apart methods of the prior art. The so called wet mode facilitates the removal of the carrier layer and thereby substantially mitigates and/or eliminates the aforementioned problems associated with the aforementioned dry mode peel apart processes.

Moreover, the method of the present invention, in combination with those methods of fabricating printed circuit boards and the like which use a peel apart structure such as the three aforedescribed prior art circuit board fabrication methods, for example, preferably provides a fluid that reduces the bond strength between the carrier layer and the conductive layer of the peel apart structure, and applies the fluid as the carrier layer is being peeled away from the conductive layer.

Thus, in one application, the inventive method has been used with an aforedescribed commercially available peel apart conductive structure which comes as stock in the form of a flexible planar sheet, and has a conductive layer of electrolytic plated copper approximately 0.0002 inches thick, herein sometimes referred to as the thin copper, a carrier layer of electrolytic copper foil apprroximately 0.0028 inches thick, and an intermediate chromium separator layer of negligible thickness. The bond strength between the conductive and copper layers has found to vary randomly in the range of approximately 2 to 4 psi, thus making it difficult to peel away the copper carrier from the other copper when the dry mode is employed. As a consequence, if a dry mode peel apart process was to be used, a uniform peel apart force cannot be applied without the concomitant deleterious effects resulting as previously described and hence the dry mode peel apart process is not readily amenable to mass production impelentation.

On the other hand, in a preferred embodiment of the present invention, $H_2O$ and preferably de-ionized water is applied between the copper carrier and the thin copper of the peel apart structure as the carrier copper is being peeled away therefrom. Tests were performed using peel apart structures, which were of the aforedescribed commercially available kind and laminated to glass epoxy laminates. $H_2O$ applied in accordance with the principles of the present invention as the carrier copper was being peeled away, produced an approximate 35 to 40% reduction in the average bonding strength between the carrier copper and the thin copper. Moreover, as a result, the integrity of the thin copper was not adversely affected.

Similar results are obtainable with other fluids. Thus, in another embodiment, concentrated HCl when applied produced similar results with approximately the same reduction in the bond strength. Other embodiments of $FeCl_3$ and of $KMnO_4/KOH$, respectively, when applied also produced similar results with approximately the same reduction in the bond strength.

With the reduction in bond strength between the carrier copper and the other copper in accordance with the principles of the present invention, the peel apart operation is more reliable, simplified and/or readily implementable for mass production.

The fluid may be applied by any suitable means such as, for example, a sponge-like pad, a drip applicator, an atomizer, etc., to name just a few.

It should be understood that depending on the composition of the peel apart structure, other compatible fluids may be used to reduce the bond strength when applied during the peeling operation. Preferably, non-contaminating and/or non-toxic fluids are used and particularly for those applications where the peel apart structure is used in the manufacture of high quality precision printed circuit boards and the like.

Thus, while the invention has been described with reference to preferred embodiments thereof, it will be understood by those skilled in the art that various changes in form and details may be made without departing from the scope of the invention.

I claim:

1. A method for stripping a peel apart structure, said peel apart structure having an electrolytic plated copper first layer in a predetermined superimposed and peelably adhered relationship with an electrolytic copper foil carrier second layer, said first and second layers having an average bond strength therebetween of approximately two to four psi, said method comprising the steps of:
   providing water for reducing said average bond strength between said first and second layers approximately thirty to forty percent,
   mechanically peeling apart said first and second layers, and
   applying said water in a chemically inert manner between said first and second layers during the peel apart operation between said first and second layers.

2. The method according to claim 1 wherein said water is deionized water.

3. The method according to claim 1 wherein said peel apart structure further has release agent member means disposed between said first and second layers.

4. The method according to claim 3 wherein said release agent member means is chromium.

5. In a method for making printed circuit boards, said method using at least one peel apart conductive flexible planar sheet structure having an electrolytic plated copper first layer in a predetermined superimposed and peelably adhered relationship with an electrolytic copper foil carrier second layer, said first and second layers having an average bond strength therebetween of approximately two to four psi, and a metal release agent third layer disposed between said first and second layers, said first and second layers having an average bond strength therebetween of approximately two to four psi, said method further including a step for mechanically peeling said second layer from said first layer, the combination therewith comprising the steps of:
  providing deionized water for reducing said bond strength between said first and second layers approximately thirty to forty percent, and
  applying said deionized water in a chemically inert manner between said first and second layers during said peeling step.

6. The method according to claim 5 wherein said first layer is approximately 0.0002 inches thick.

7. The method according to claim 6 wherein said second layer is approximately 0.0028 inches thick, and said third layer has a relative negligible thickness.

8. The method according to claim 5 wherein said third layer is chromium.

* * * * *